United States Patent [19]

Motegi et al.

[11] Patent Number: 4,691,321

[45] Date of Patent: Sep. 1, 1987

[54] SEMICONDUCTOR LASER DEVICE HAVING CURRENT CONFINING AND BUILT-IN WAVEGUIDE STRUCTURE

[75] Inventors: Nawoto Motegi, Kanagawa; Yukio Watanabe; Naohiro Shimada, both of Yokohama; Masaki Okajima, Kunitachi, all of Japan

[73] Assignee: Kabushiki Kaisha Toshiba, Japan

[21] Appl. No.: 686,478

[22] Filed: Dec. 26, 1984

[30] Foreign Application Priority Data

Dec. 26, 1983 [JP] Japan .................................. 58-246148

[51] Int. Cl.$^4$ .............................................. H01S 3/19
[52] U.S. Cl. ......................................... 372/46; 372/45
[58] Field of Search ................ 372/44, 45, 46; 357/17

[56] References Cited

FOREIGN PATENT DOCUMENTS 54-12795   3/1979   Japan .
57-5070    1/1982   Japan .

OTHER PUBLICATIONS

J. J. Coleman et al., "Single-Longitudinal-Mode Metal-organic Chemical-Vapor-Deposition Self-Aligned GaAlAs-GaAs Double-Heterostructure Lasers", *Appl. Phys. Lett.*, vol. 37, No. 3, Aug. 1, 1980, pp. 262-263.

*Primary Examiner*—James W. Davie
*Attorney, Agent, or Firm*—Banner, Birch, McKie & Beckett

[57] ABSTRACT

A hetero junction type semiconductor laser device is provided wherein a hetero layer is formed on a clad layer leaving a stripe shape portion. The clad layer is formed on an active layer over a substrate. At least two coating layers of the same conductivity type as the clad layer are formed on the hetero layer so as to have a current confining effect and a built-in waveguide effect. The refractive index of the coating layers which is nearer to the active layer is greater than the refractive index of the clad layer and the refractive index of the other coating layer is smaller than the refractive index of the coating layer which is nearer to the active layer. Using this construction, a low lasing threshold current is achieved.

21 Claims, 10 Drawing Figures

SEMICONDUCTOR LASER DEVICE HAVING CURRENT CONFINING AND BUILT-IN WAVEGUIDE STRUCTURE

BACKGROUND OF THE INVENTION

This invention relates generally to the field of lasers, and more particularly, is directed to a semiconductor laser device having a current confinement structure and a built-in waveguide structure.

With the increased use in recent years of optical disk devices, such as digital audio discs, video discs, and "document files," and the spread of fiber optic communications, mass production of semiconductor lasers, which provide the light source of these applications, has become essential. In the manufacture of conventional semiconductor lasers, a liquid phase epitaxial process (referred to hereafter as "LPE") is used for the crystal growth on the substrate. The LPE process, however, is not suitable for mass production of semiconductor lasers for the following reasons. First, the LPE process may not be used with a large size semiconductor substrate. Second, the process is not suitable for sufficiently controlling crystal growth on the substrate. Finally, the process requires a substantial amount of time to complete. For these reasons, other processes for crystal growth, such as molecular beam epitaxy (referred to hereafter as "MBE") and metalorganic chemical vapor deposition (referred to hereafter as "MOCVD"), have been used for mass production of semiconductor lasers.

A semiconductor laser having a suitable construction for manufacture by the MOCVD process is disclosed in Applied Physics Letters, Vol. 37, No. 3, p. 262 and is illustrated in FIG. 1. As shown in FIG. 1, current confining layer 5 which confines the current to the direction parallel to the junction plane and controls the transverse mode of the laser, is provided in upper clad layer 4 formed on flat active layer 3. The active layer 3 is formed from a different conductive type material than neighboring p-type clad layer 4 and p-type coating layer 6. Thus, no current flow passes through layer 5. Active layer 3 is formed on an n-GaAs substrate through an n-GaAlAs clad layer 2 and p-GaAlAs clad layer 4 is covered with a p-GaAs contact layer. Further, the p-GaAs contact layer and the n-GaAs substrate have a pair of metal electrodes 7, 8, respectively.

Current injection to active layer 3 is restricted to a stripe shape groove portion wherein current confinging layer 5 is partially removed. Also, the thickness of clad layer 4 is so thin that wave guided light in active layer 3 is capable of spreading to current confining layer 5 and coating layer 6. Therefore, the propagation constant of the vertical mode to the junction plane just beneath the strip is different than the propagation constant of the vertical mode to the side portion of the stripe. It can be considered that the tranverse mode, which is horizontal to the junction plane, is wave guided in accordance with the distribution of the effective refractive index. The effective refractive index is given as the propagation constant of the vertical mode to the junction plane divided by the propagation constant of light in a vacuum. Thus, a wave guided mode is generated just beneath the stripe. This type of laser device produces both a current confinement effect in the horizontal direction of the junction plane by confining the current in layer 5 and a built in refraction index waveguide effect. Thus, it is reported that a low threshold, of around 50 mA, is achieved with room temperature pulse oscillation and that single mode oscillation is achievable so that the transverse mode can be controlled satisfactorily.

It is very important for semiconductor lasers to have a low threshold not only to improve their life span and to reduce operating current, but also to improve the performance of the laser. Buried hetero structures (BH) and transverse junction stripe structures (TJS) are typical examples of conventional lasers having a low threshold value of 10 to 20 mA or less. In contrast, the threshold value of a laser with the construction shown in FIG. 1 is 50 mA which is more than double the value for lasers with BH and TJS structures. Tests conducted by the inventors showed that with present structures, it is difficulet to reduce the threshold value. The reason for the difference between the laser illustrated in FIG. 1 and lasers having a BH or TJS structure is probably due to differences in the waveguide effects in the structures.

With the structure of FIG. 1, light guided by active layer 3 infiltrates through the clad layer 4 to current confining layer 5 and is subjected to absorption. Thus, differences in the imaginary parts of the equivalent complex refractive index are produced in the horizontal direction at the junction plane, thereby giving an absorption loss guide in which light is guided.

In the case of a BH or TJS structure, the real part of the complex refractive index is affected by infiltration of light wherein light is guided through differences in the real parts, i.e., refraction indexes. Accordingly, the threshold value is probably increased by an amount corresponding to the absorption loss in the structure shown in FIG. 1.

Considering the above mentioned drawbacks of waveguide loss structures, it is better to make refractive index structure lasers which do not have a high absorption loss. A semiconductor laser of this type is shown in FIG. 2. This device basically includes the same layers as in the device shown in FIG. 1, however, clad layer 4 is thick enough not to infiltrate light to current confining layer 5 which has a high refractive index and absorbs lights. Coating layer 6, which has a higher refractive index than clad layer 4 and does not absorb light, is provided at the stripe shape groove portion.

In this structure, light guided in active layer 3 infiltrates to coating layer 6, which has a higher refractive index just beneath the stripe, and to clad layer 4, which has a lower refractive index at the sides of the stripe. Thus, there are produced differences of effective refractive indexes of the traverse mode to the vertical direction of the junction plane between the inside and outside of the stripe, making a waveguide by the refractive index waveguide effect so as to confine light only beneath the stripe.

It has been found, however, that lasers manufactured in accordance with FIG. 2 often fail to achieve a low threshold value. The reason for this condition is believed to be the actual structure itself. It has been found that in the structure of FIG. 2, there is considerable leakage of laser light into coating layer 6 at the sides of the stripe shape groove portion. This situation will be explained in more detail with reference to FIG. 3. FIG. 3 illustrates calculated curves indicating the relationship between effective refractive index Neff of the lowest waveguide mode in the light waveguide path and refractive index Nc of the higher refractive layer provided at one side of the light waveguide path in the typical double-hetero structure laser. This mathematical model corresponds to the portion of the structure just beneath the stripe of the laser shown in FIG. 2. FIG. 3 indicates that the effective refractive index Neff gradually increases when the refractive index Nc of coating layer 6 is increased with a fixed thickness of clad layer 4. Note, however, that the increase in Neff is rather small compared to the increase in Nc. Thus, Neff>Nc is true only when Nc is relatively small and Neff=Nc at a certain larger value of Nc. If Nc is beyond this larger value, Neff is smaller than Nc. This means that the outside of the light wave guided path has a larger value in refractive index thus causing infiltration of light to the outside and therefore, no waveguide mode exists. In other words, the waveguide mode is cut off when Neff=Nc. Thus, the refractive index of clad layer 4 should be at a minimum, a value which does not cause "cut off", and a maximum value where $\Delta$Neff=Neff-−Neff° (Neff° is the effective refractive index when there is no coating layer 6) by providing coating layer 6. FIG. 3 also indicates that the increase of the effective refractive index depends on the thickness of clad layer 4. The smaller the thickness, the larger the increase in effective refractive index.

In designing the ideal waveguide portion of the laser structure shown in FIG. 2, the following should be considered. First, the $\Delta$Neff should be larger than $10^{-3}$ in order to stabilized control of the traverse mode in the horizontal direction of the junction plane. Second, thickness h of clad layer 4 should be as large as possible in order to obtain a higher manufacturing yield and to minimize damaged to the active layer when the groove portion is etched adjacent the active layer. It is clear that these ideal considerations are inconsistent. For example, if 0.3 $\mu$m is selected as the thickness of clad layer 4, which is practically easy to realize, the refractive index of coating layer 6 should be very near to cut off in order to realize $\Delta$Neff=$10^{-3}-10^{-2}$ in accordance with FIG. 3.

For a laser having the structure shown FIG. 2, it is necessary to establish structural parameters near cutoff of the waveguide mode. This causes the lasing threshold value to be higher than expected due to the following problems. The first problem is that the lasing threshold is apt to become the condition of cutoff because of variations in the thickness and refractive index in active layer 3, clad layer 4 and coating layer 6. Another problem is that the cut off condition of the waveguide mode depends upon the thickness of clap layer 4. Thus, the waveguide mode often becomes cut off where thickness h is larger even if there exists a waveguide mode where thickness h is smaller. In the structure shown in FIG. 2, even if it is designed to be waveguided in the flat portion just beneath the stripe shape groove, the sides of the stripe corresponds to the portion wherein thickness h of clad layer 4 becomes substantially larger and thus it becomes a cutoff condition for the waveguide mode. This phenomenon is also made clear by the fact that radiant brightnesses appear at the sides of the stripe on top of the active layer. This fact is revealed in infrared microscope examintion of this type of laser.

In a laser with the structure of FIG. 2, the threshold current is expected to be lower than in a laser with the structure of FIG. 1 due to the change from a loss waveguide structure to a refraction index waveguide structure. However, it is not always possible to obtain a lower threshold because of the above mentioned new losses.

SUMMARY OF THE INVENTION

It is, therfore, an object of the invention to provide a semiconductor laser device having sufficient current confinement effect.

It is still further object of the invention to provide a semiconductor laser device suitable for various applications such as optical disk drives.

It is another object of the present invention to provide a semiconductor laser device that makes it possible to ensure production of waveguide effects through differences in effective refractive indices.

It is a still further object of the present invention to provide a semiconductor laser device having a lower threshold value than semiconductor lasers known in the art.

In the present invention, the coating layer comprises two or more layers and the differences in effective refractive indices are maintained relatively large while losses due to light infiltrating into the coating layer are suppressed.

According to the invention, a hetero junction type semiconductor laser device is provided having current confining and build-in waveguide effects. A hetero junction layer of a different conduction type than the clad layer is formed on the clad layer with a stripe shape groove portion and a coating layer of the same conduction type as the clad layer is formed on top of this. The coating layer is formed from at least two layers. A first coating layer, which is nearer the active layer, has a refractive index greater than that of the clad layer. A second coating layer, which is further away from the active layer than the first coating layer, has a refractive index that is smaller than that of the first coating layer.

Since the embedded layer in the stripe shape groove portion of the present invention is formed of at least two layers comprising a high refractive index layer and a low refractive index layer, light infiltrating into the stripe groove portion is affected by the high refractive layer so that the effective refractive index distribution in the horizontal direction at the junction plane is maximum at the stripe shape groove portion. Also, the effect of the existing low refractive index layer outside of the high refractive index layer prevents cutoff of the waveguide mode and has a large effective refractive index distribution even when the distance between the first coating layer and the active layer is large or where a higher refractive index is selected for the first coating layer.

It is thus possible to maintain the threshold current at a minimum and to achieve satisfactory reduction of the threshold value in refractive index waveguide type lasers.

BRIEF DESCRITPION OF THE DRAWINGS

DESCRIPTION OF THE PREFERRED EMBODIMENT

Figure 4:
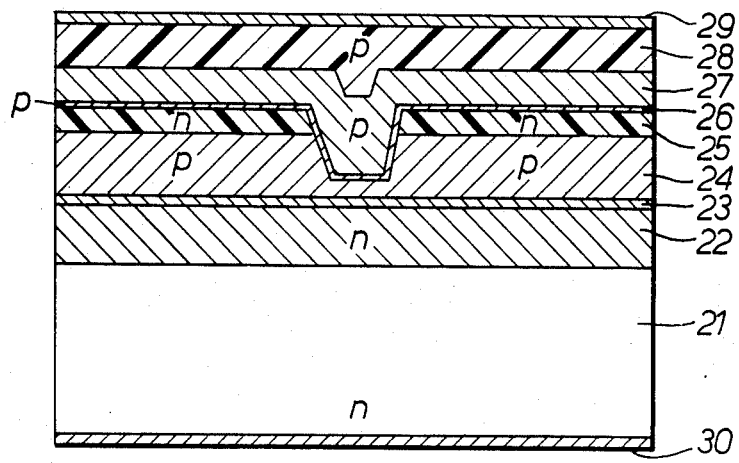
FIG. 4 is a cross-sectional view of a semiconductor laser in accordance with the present invention.

FIG. 4 is a cross-sectional view showing the general construction of a semiconductor laser according to one embodiment of the present invention. In the drawing, 21 is an N - GaAs substrate, 22 an N - $Ga_{0.65}Al_{0.35}As$ clad layer, 23 a $G_{0.92}Al_{0.08}As$ active layer, 24 a P - $Ga_{0.65}Al_{0.35}As$ clad layer, 25 an N - GaAs current confining layer (hetero layer), 26 a P - $Ga_{0.8}Al_{0.2}As$ first coating layer, 27 a P - $Ga_{0.65}Al_{0.3}As$ second coating layer and 28 a P - GaAs contact layer. Elements 29 and 30 are metal electrode layers.

Figure 5A:
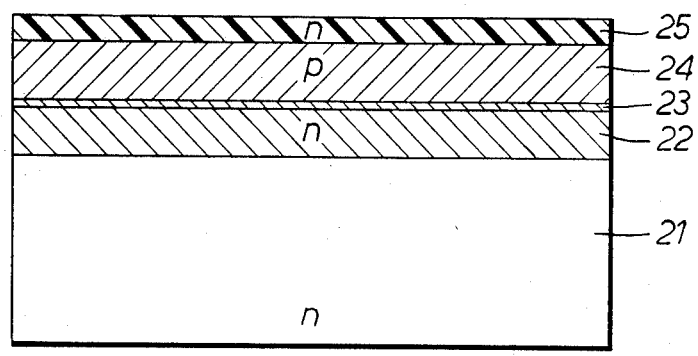
FIGS. 5A through 5C show intermediate stages for manufacturing the semiconductor laser shown FIG. 4.
Figure 5B:
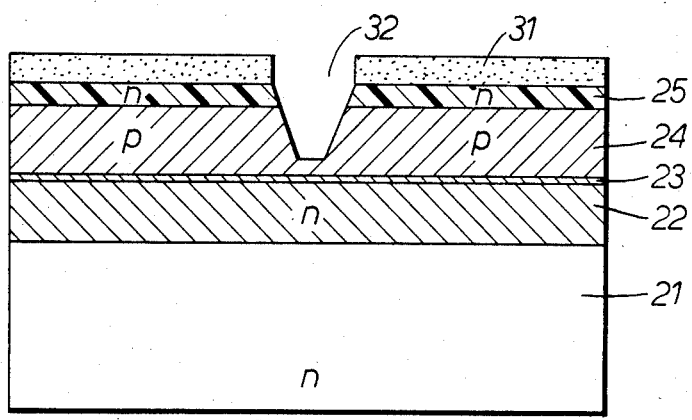
Figure 5C:
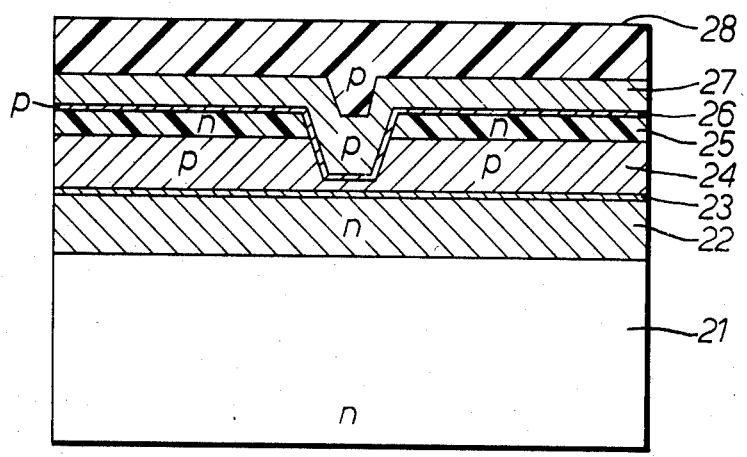

A laser with the above construction is produced by the stages shown in FIGS. 5A–5C. First, as shown in FIG. 5A, N - $Ga_{0.65}Al_{0.35}As$ clad layer 22 1.5 μm thick, (se doping, $1 \times 10^{17}$ cm$^{-3}$), undoped $Ga_{0.92}Al_{0.08}As$ active layer 23 0.08 μm thick, p - $Ga_{0.65}Al_{0.35}As$ clad layer 24 1.5 μm thick (Zn doping, $7 \times 10^{18}$ cm$^{-3}$) and N - GaAs current confinging layer (hetero layer) 1 μm thick (Se doping, $5 \times 10^{18}$ cm$^{-3}$) are successively grown on substrate 21 (Si doping, $1 \times 10^{18}$ cm$^{-3}$). MOCVD is used in this first crystal growth stage. The growth conditions are at a substrate temperature of 750° C., a gas flow ratio of [V]/[III] = 20 and a carrier gas ($H_2$) flow rate of 10 l/min. The raw materials used are trimethyl gallium (TMG:(CH$_3$)$_3$GA, trimethyl aluminium (TMA:(CH$_3$)$_3$Al), arsine (AsH$_3$), diethyl zinc (DEZ:($C_2H_5$)$_2$Zn) as a p-dopant and hydrogen selenide ($H_2Se$) as an n-dopant. The growth rate is 0.25 μm/min. It is not absolutely necessary to use the MOCVD process in the first crystal growth stage but where mass production is desired, the MOCVO process permits crystal growth with good uniformity over a large surface area and thus is more advantageous than the LPE process.

In the next stage, as shown in FIG. 5B, photoresist 31 is coated on current confining layer 25. Resist 31 defines a stripe-shaped window 3 μm wide and serves as a mask in selective etching of current confining layer 25. An etching process in then used to form stripe-shaped groove 32. After removal of resist 31 and a surface washing treatment, a second crystal growth stage is effected by the MOCVD process. A 0.3 μm thick p - $Ga_{0.8}Al_{0.2}As$ first coating layer 26, P - $Ga_{0.65}Al_{0.35}As$ second coating layer 27 and P - GaAs coating layer 28 (Zn doping, $5 \times 10^8$ cm$^{-3}$) are grown and formed over the whole surface as shown in FIG. 5C. Subsequently, a Cr—Au electrode 29 is attached to the top of contact layer 28 and an Au—Ge electrode 30 is attached to the lower surface of substrate 21 by a normal electrode attachment process.

The refractive indices of the above embodiment are 3.59 in active layer 23, 3.385 in clad layers 22, 24, 3.45 in first coating layer 26 and 3.385 in second coating layer 27.

The operating characteristics of a laser formed from the above structure with a resonator length of 250 μm were found to be excellent. The threshold current was low at about 35 mA and the differential quantum efficiency was high at about 50%. Also, a current-light output characteristic with good linearity was achieved with no kinks up to an output of 12 mW or more. Further, the beam waist in the horizontal and vertical directions at the junction surface where laser light was radiated from the end surface coincided with the end surface. This confirmed the pressence of a good refractive index guide effect.

These excellent operating characteristics are believed to be achieved for the following reason. In a slab waveguide path, if a waveguide is made in the path, the effective refractive index of the mode must be an intermediate value between the highest refractive index among all the layers forming the waveguide path and the higher refractive index of the outer most layers forming the waveguide path. If the effective refractive index is smaller than that of the outer most higher refractive index layer of the waveguide path, light is directed to the outside of the waveguide path so that no waveguide mode can exist.

Figure 1:
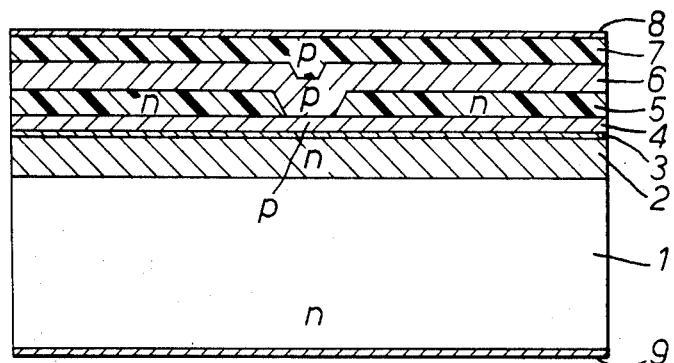
FIG. 1 is a cross-sectional view of a conventional double-hetero structure semiconductor laser.
Figure 2:
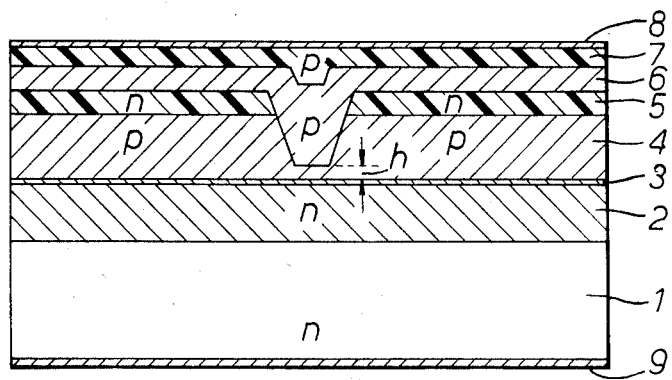
FIG. 2 is a cross-sectional view of an improved semiconductor laser.

When refractive indices in both of the outer layers of the waveguide path are equal and the average refractive index of the inner layers is higher than the refractive index of the outer layers, the waveguide mode can exist. However, in a waveguide path having an asymmetrical distribution of refractive indices such as shown in FIG. 2, no waveguide mode can exist even though the above condition of effective refractive index is satisfied. Such a cutoff of the waveguide mode easily occurs in double hetero structure lasers having a rather thin active layer and where the effective refractive index of the waveguide is close to the refractive index of the clad layer. The waveguide mode is apt to be cut off when there is a difference in refractive indices of both clad layers or when a higher refractive layer is provided close to one of the clad layers as shown in FIG. 2.

This problem can be overcome by providing a lower refractive index layer (second coating layer) outside of the high refractive index layer (first coating layer). The lower refractive index layer refracts light which might be dispensed outside of the higher refractive index layer when there is no lower refractive index layer. Thus, the waveguide mode can be formed.

Figure 3:
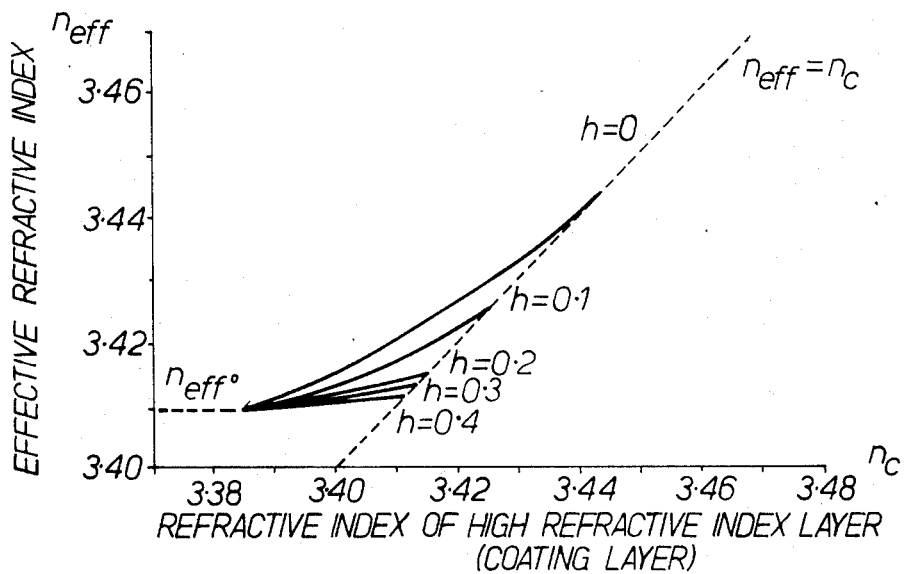
FIG. 3 is a graph showing the operating characteristics of the laser shown in FIG. 2.
Figure 6A:
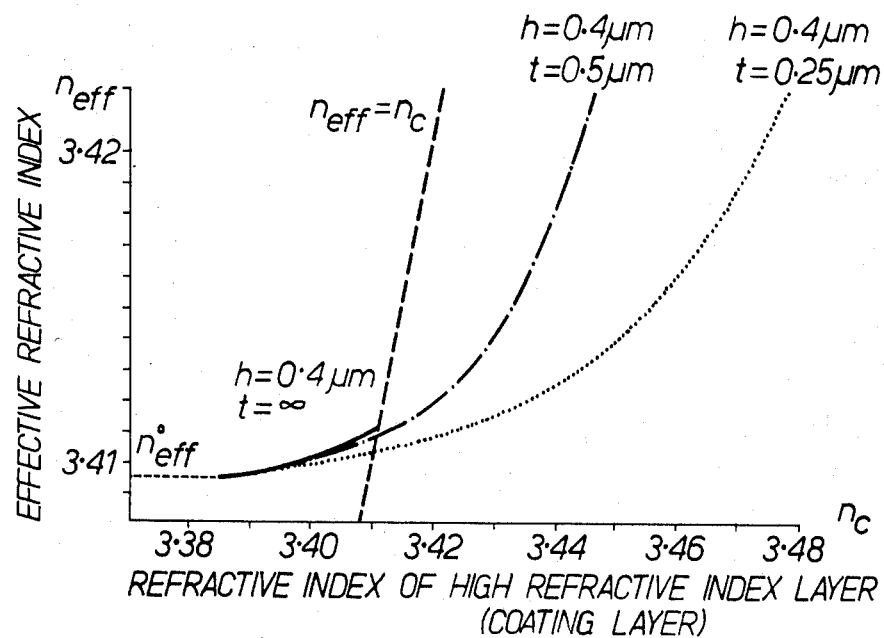
FIG. 6A is a graph showing the operating characteristics of the laser shown in FIG. 4.
Figure 6B:
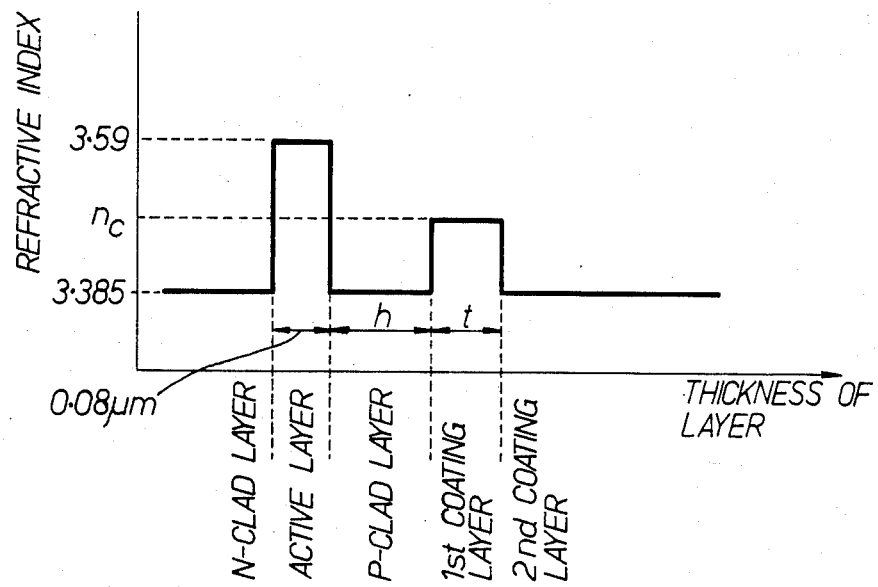
FIG. 6B shows the refractive indices and parameters used for calculating the curves shown in FIG. 6A.

FIG. 6A shows operating characteristic curves of the refractive index Neff when the refractive index Nc of high refractive index layer is changed when there is a lower refractive index layer. FIG. 6B shows parameters for deriving the curves of FIG. 6A. The thickness of the active layer is 0.08 μm, h indicates the thickness of clad layer 24, t indicates the thickness of the high refractive index layer, i.e., first coating layer 26. The solid line shown as t = ∞ in FIG. 6A is theoretically equivalent to the condition in which no lower refractive index layer is provided as in FIG. 3. In this case, there is a cut off condition defined by Neff=Nc so that Neff cannot be large. It is possible to obtain a large effective refractive index Neff without cutoff when the lower refractive index layer is provided as shown by the dotted line (t=0.25 μm) or the dot and dash line (t=0.5 μm) in FIG. 6A.

The refractive index of the second coating layer is equal to that of the clad layer in calculating the curves shown in FIG. 6A. In this situation, cut off may not occur. It is noted, however, that this situation is not always necessary. When the refractive index of the second coating layer is different from that of the clad layer, cut off may occur at a very high value of the effective refractive index compared to the condition in which the second coating layer is not provided. Thus, the increment ΔNeff can be easily realized at $10^{-3} - 10^{-2}$ according to the present invention. Also, cut off does not occur at the sides of the stripe shape groove portion so that threshold current can be maintained low to achieve a lower threshold value.

Figure 7:
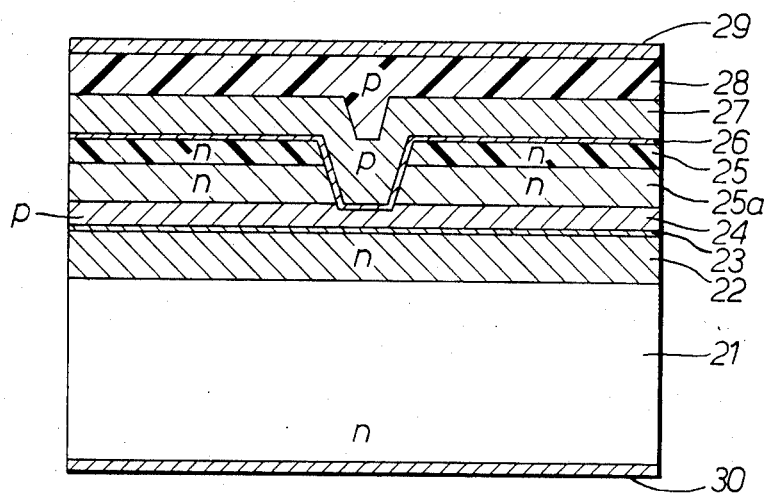
FIG. 7 is a cross-sectional view of a semiconductor laser in accordance with another embodiment of the present invention.

FIG. 7 is a cross-sectional view showing the general structure of a semiconductor laser according to another embodiment of the invention. Parts that are the same as in FIG. 4 are identified by the same numbers and a detailed description thereof will be omitted. The difference between this embodiment and the embodiment described above is that the hetero layer is made of two layers. That is, n - $Ga_{0.4}Al_{0.6}As$ second hetero layer 25a is inserted between p - GaAlAs clad layer 24 and n - GaAs first hetero layer 25. This contributes to producing a smaller effective refractive index for the mde guided by active layer 23 in the region on opposite sides of the stripe. Thus, in addition to the effect caused by first coating layer 26, it is also possible to produce a large effective index distribution immediately below the stripe. An advantage of the introduction of the second hetero layer 25a is that the reactive current component that spreads through p - clad layer 24 in the embodiment of FIG. 4 is reduced by an amount corresponding to the reduction of the thickness of p - clad layer 24.

The invention is not limited to the embodiments described above. For example, the structural material is not limited to being GaAlAs but other compound semiconductor materials may be used such as InGaAsP or AlGaInP, etc. Also, the MBE process may be used instead of the MOCVD process. Further, it is possible to use a P type material as the substrate and reverse the condution types of the various layers. Other variations are possible provided the essentials of the invention are not departed from.

What is claimed is:

1. A semiconductor laser device having a resonant cavity, said device comprising:
    a substrate;
    a first clad layer of a first conductive type formed on one surface of said substrate;
    an active layer formed on said first clad layer;
    a second clad layer of a second conductive type formed on said active layer and having a groove portion;
    a first current confining layer of said first conductive type covering said second clad layer and having a strip shape opening corresponding to said groove portion;
    a first coating layer of said second conductive type covering said current confining layer and said opening having a refractive index larger than the refractive index of said second clad layer;
    a second coating layer of said second conductive type covering said first coating layer and having a refractive index smaller than the refractive index on said first coating layer; and
    a pair of electrodes attached to said second coating layer and said substrate respectively.

2. A semiconductor laser according to claim 1 wherein said second clad layer has a groove portion corresponding to said stripe shape portion of said current confining layer.

3. A semiconductor laser according to claim 1 wherein the refractive index of said second second clad layer is substantially equal to the refractive index of said coating layer.

4. A semiconductor laser according to claim 1 wherein the refractive index of said first coating layer is smaller than the refractive index of said active layer.

5. A semiconductor laser according to claim 1 wherein the thickness of said first coating layer is smaller than the thickness of said second coating layer.

6. A semiconductor laser according to claim 1 further comprising a second current confining layer of said first conductive type formed between said second clad layer and said current confining layer.

7. A semiconductor laser according to claim 6 wherein the thickness of said second clad layer is smaller than the thickness of said first clad layer.

8. A semiconductor laser according to claim 1 further comprising a contact layer of said second conductive type formed between said second coating layer and one of said electrodes.

9. A semiconductor laser according to claim 1 wherein said first conductive type is N - type and said second conductive type is P - type.

10. A semiconductor laser device having a resonant cavity, said device comprising:
    a substrate having a first conductive type;
    a first clad layer of a first conductive type formed on said substrate;
    an active layer formed on said first clad layer;
    a second clad layer of a second conductive type formed on said active layer and having a groove portion;
    a current confining layer of said first conductive type formed on said second clad layer and having a stripe shape opening corresponding to said groove portion;
    a first coating layer of said second conductive type formed on said current confining layer and on said groove portion of said second clad layer and having a refractive index larger than the refractive index of said second clad layer;
    a second coating layer of said second conductive type formed on said first coating layer and having a refractive index smaller than the refractive index of said first coating layer;
    a contact layer of said second conductive type formed on said second coating layer; and
    a pair of electrodes attached to said contact layer and said substrate, respectively.

11. A semiconductor laser according to claim 10, wherein the refractive index of said first coating layer is smaller than the refractive index of said active layer; and
    the refractive index of said second coating layer is substantially equal to the refractive index of said second clad layer.

12. A semiconductor laser according to claim 11 wherein the thickness of said first coating layer is substantially equal to the thickness of said groove portion of said second clad layer.

13. A semiconductor laser according to claim 1 wherein said stripe shape portion extends parallel along the longitudinal direction of said device.

14. A semiconductor laser according to claim 10 wherein said groove portion extends parallel along the longitudinal direction of said device.

15. A semiconductor laser according to claim 10 wherein said current confining layer has a stripe shape portion which corresponds to said groove portion of said second clad layer.

16. A semiconductor laser according to claim 1 wherein the thickness of said second coating layer is larger than the thickness of said first coating layer.

17. A semiconductor laser according to claim 6 wherein the refractive index of said second current confining layer is equal to or smaller than the refractive index of said second coating layer.

18. A semiconductor laser according to claim 6 wherein the thickness of said second current confining layer is selected such that the thickness of said second clad layer beneath said stripe shape portion is substantially the same as the thickness of said second clad layer beneath said second current confining layer.

19. A semiconductor laser according to claim 10 further comprising a second current confining layer of said first conductive type formed between said second clad layer and said current confining layer.

20. In a semiconductor laser device having a current confining structure and a built-in waveguide, said device having a substrate, a first clad layer of a first conductive type formed on one surface of said substrate, an active layer formed on said first clad layer, a second clad layer of a second conductive type formed on said active layer and having a groove portion, a current confining layer of said first conductive type formed on said second clad layer and having a stripe shape opening corresponding to said groove portion, a coating layer of said second conductive type formed on said current confining layer and said opening, and a pair of electrodes attached to said coating layer and said substrate, respectively, wherein the improvement comprises:

said coating layer having at least first and second coating layers formed between said second clad layer and one of said electrodes, said first coating layer being formed on said second clad layer and said second coating layer being formed on said first coating layer;

the refractive index of said first coating layer being larger than the refractive index of said second clad layer; and the refractive index of said second coating layer being smaller than the refractive index of said first coating layer.

21. In a semiconductor laser device having a current confining structure and a built-in waveguide, said device having a substrate, a first clad layer of a first conductive type formed on one surface of said substrate, an active layer formed on said first clad layer, a second clad layer of a second conductive type formed on said active layer and having a groove portion arranged to narrow the thickness of said second clad layer, a current confining layer of said first conductive type formed on said second clad layer and having a stripe shape opening corresponding to said groove portion of said second clad layer, a coating layer of said second conductive type formed on said current confining layer, a contact layer of said second conductive type formed on said coating layer, and a pair of electrodes attached to said coating layer and said substrate, respectively, wherein the improvement comprises:

said coating layer having at least first and second coating layers formed between said second clad layer and one of said electrodes, said first coating layer being formed on said second clad layer and said second coating layer being formed on said first coating layer;

and that the refractive index of said first coating layer being larger than the refractive index of said second clad layer; and the refractive index of said second coating layer being smaller than the refractive index of said first coating layer.

* * * * *